United States Patent [19]

Mizutani et al.

[11] Patent Number: 5,268,309
[45] Date of Patent: Dec. 7, 1993

[54] METHOD FOR MANUFACTURING A PHOTOSENSOR

[75] Inventors: Hidemasa Mizutani, Sagamihara; Jun Nakayama, Atsugi; Masaru Nakayama, Atsugi; Ken Yamaguchi, Atsugi; Kazuhiko Muto, Kawasaki; Yasuteru Ichida, Machida, all of Japan

[73] Assignee: Canon Kabushiki Kaisha, Tokyo, Japan

[21] Appl. No.: 796,441

[22] Filed: Nov. 22, 1991

Related U.S. Application Data

[60] Division of Ser. No. 713,607, Jun. 11, 1991, Pat. No. 5,101,253, which is a continuation of Ser. No. 590,492, Oct. 1, 1990, abandoned, which is a continuation of Ser. No. 355,795, May 22, 1989, abandoned, which is a continuation of Ser. No. 220,952, Jun. 21, 1988, abandoned, which is a continuation of Ser. No. 769,683, Aug. 27, 1985, abandoned.

[30] Foreign Application Priority Data

Sep. 1, 1984 [JP] Japan .................. 59-183149

[51] Int. Cl.$^5$ .................................... H01L 31/18
[52] U.S. Cl. .................................... 437/3; 437/59; 437/153
[58] Field of Search .................. 437/51, 60, 153, 47, 437/3

[56] References Cited

U.S. PATENT DOCUMENTS

| | | | |
|---|---|---|---|
| 4,266,237 | 5/1981 | Hendrickson | 257/290 |
| 4,346,395 | 8/1982 | Ouchi | 257/292 |
| 4,389,534 | 6/1983 | Winterling | 257/53 |
| 4,488,038 | 12/1984 | Harrison et al. | 357/15 |
| 4,523,217 | 6/1985 | Jibu | 257/106 |
| 4,625,225 | 11/1986 | Goodfellow | 257/184 |
| 4,636,829 | 1/1987 | Greenwood | 257/257 |
| 4,651,016 | 3/1987 | Hirao | 257/290 |

FOREIGN PATENT DOCUMENTS 59-27104 of 1975 Japan .
62-14478 of 1985 Japan .

OTHER PUBLICATIONS

"Photoamplifier Having Dynamic Compensation of the ... Photodetectors", Sebko et al., Sov. J. Opt. Technol. 46(8), Aug. 1979, 486-487.
"A New Generation of MOS/Bipolar Operational Amplifiers", RCA Review, vol. 37, No. 3, Sep. 1976, pp. 404-424; Schade.
"Low-Noise Preamplifier for Photoconductive Detectors" Dereniak, et al., Rev. Sci. Instrum., vol. 48, No. 4, Apr. 1977, pp. 392-394.

Primary Examiner—Olik Chaudhuri
Assistant Examiner—Long Pham
Attorney, Agent, or Firm—Fitzpatrick, Cella, Harper & Scinto

[57] ABSTRACT

Disclosed is a photo sensor in which a photoelectric converter having a P-N junction and an amplifying section having a bipolar transistor to amplify an output of this converter are integrally formed in a semiconductor substrate. The input stage of the amplifying section has an insulating gate type transistor, and the output of the photoelectric converter is inputted to the gate electrode of this transistor. The photosensing surface of the photoelectric converter is covered by a transparent ptotection film, and a thickness of this film is determined so as to make the reflection factor of the incident light at the photo sensing surface of the photoelectirc converter zero. In manufacturing of this photo sensor, the base region of the bipolar transistor and one region of the P-N junction of the photoelectric converter of the same conductivity type as the base region are simultaneously formed.

5 Claims, 2 Drawing Sheets

METHOD FOR MANUFACTURING A PHOTOSENSOR

This application is a division of application Ser. No. 713,607 filed Jun. 11, 1991, now U.S. Pat. No. 5,101,253, which is a continuation of application Ser. No. 590,492 filed Oct. 01, 1990, now abandoned, which is a continuation of application Ser. No. 355,795 filed May 22, 1989, now abandoned, which is a continuation of application Ser. No. 220,952 filed Jun. 21, 1988, now abandoned, which is a continuation of application Ser. No. 769,683 filed Aug. 27, 1985, now abandoned.

BACKGROUND OF THE INVENTION

1. Field of the Invention

The present invention relates to a photosensor having a high sensitivity which can be easily manufactured and to a method of manufacturing such a photosensor. The photo sensor according to the invention is applied to, for example, a photometric device of cameras, a distance measuring device, or the like.

2. Description of the Prior Art

Photo diodes, phototransistors, or the like are generally used as photoelectric converting elements. However, since the sensitivity which is derived by use of only such a photoelectric converting element is insufficient, the sensitivity is ordinarily improved by connecting an amplifier to this element.

However, conventional photo sensor are constituted in such a manner that the photoelectric converting element and amplifier are formed on different substrates and they are connected by way of wirings such as wire bonding; consequently, a connection leakage current exists between the photoelectric converting element and the amplifier. Therefore, particularly, in case of low illuminance (less than about $10^{-3}$ luxes) at which a photo current which is produced in the photoelectric converting element is very small, the S/N ratio is degraded.

As a photo sensor to solve such a drawback, there has been proposed a photo sensor in which a photoelectric converting element and an amplifier are integrally formed (Japanese Patent Examined Publication (Kokoku) No.27104/1984 and U.S. Pat. No.4,488,038).

However, according to the invention disclosed in the Japanese Patent Examined Publication (Kokoku) No.27,104/1984, the photoelectric converting element is integrally formed with an IIL gate. Therefore, in the case where the photo current becomes very small since the illuminance is low, the ratio between an injection current and a signal current becomes large, so that the output signal becomes unstable.

On one hand, according to the invention set forth in the Official Gazette of U.S. Pat. No.4,488,038, a transistor of the Schottky barrier type and the like are used, so that special manufacturing processes are needed.

SUMMARY OF THE INVENTION

It is an object of the present invention to provide a photosensor which can solve the above-mentioned conventional problem of the photo sensor such that the sensitivity is degraded and an output becomes unstable when an illuminance is low.

Another object of the invention is to provide a method of manufacturing a photo sensor which can solve the problem of the above-mentioned conventional manufacturing method such that special manufacturing processes are needed.

Still another object of the invention is to provide a photo sensor which is constituted in such a manner that a photoelectric converting element and an amplifier to amplify an output of this element are integrally formed, and a transistor of the insulating gate type is provided at the input stage of the amplifier, and the output of the photoelectric converting element is inputted to a gate electrode of this transistor.

Still another object of the invention is to provide a method of manufacturing a photo sensor in which at least a photoelectric converting section including a P-N junction and an amplifying section consisting of a transistor of the insulating gate type which receives an output of the photoelectric converting section and a bipolar transistor are provided in a substrate of a semiconductor of one conductivity type, characterized in that the base region of the bipolar transistor and one region of the P-N junction of the photoelectric converting section of the same conductivity type as that base region are simultaneously formed.

DETAILED DESCRIPTION OF THE PREFERRED EMBODIMENT

Figure 1:
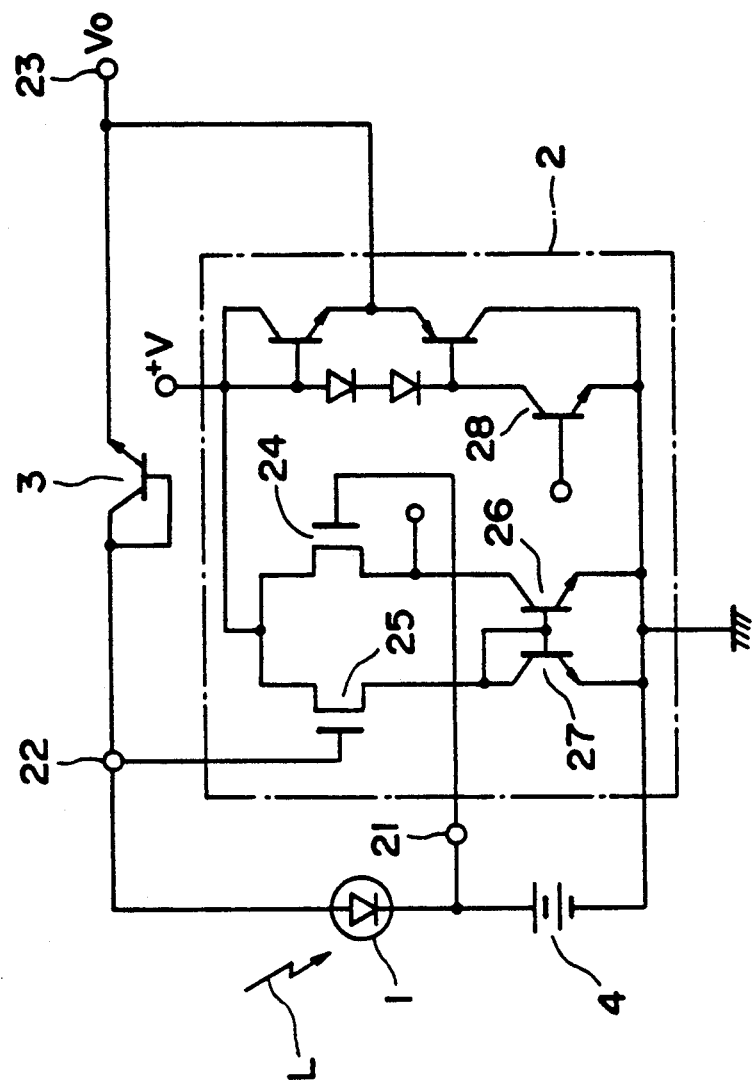
FIG. 1 is a ciucuit diagram of an embodiment of a photo sensor according to the present invention.

An embodiment of the present invention will then be described in detail hereinbelow with reference to the drawings. FIG. 1 is a circuit diagram of an embodiment of a photosensor according to the invention.

In this diagram, both terminals of a photodiode 1 are respectively connected to input terminals 21 and 22 of an operational amplifier 2. A transistor 3 for logarithm transformation is connected to the input terminal 22 and an output terminal 23 of the operational amplifier 2. A power supply 4 is also connected to the input terminal 21.

In the operational amplifier 2, the input terminals 21 and 22 are respectively connected to gates of MOS transistors 24 and 25. The MOS transistors 24 and 25 and bipolar transistors 26 and 27 constitute a differential amplifier circuit of the Bi-MOS type and serve as an input stage of the operational amplifier 2. The foregoing circuits are monolithically formed to reduce a connection leakage current as small as possible.

In this embodiment with such an arrangement, when a light L enters the photo diode 1, a photo current corresponding to the intensity of incident light L flows through the photo diode 1. This photo current is logarithm-compressed by a logarithm transforming circuit consisting of the operational amplifier 2 and transistor 3 and is outputted as an output voltage $V_0$ from the output terminal 23.

Since the input stage is constituted by the MOS transostors 24 and 25 as mentioned above, even in the case where the photo current which is allowed to flow when the light L of $10^{-3}$ luxes enters is so small to be about $10^{-12}$ amperes, it is imputted as a high impedance current with less leakage current, so that the stable output having a good S/N ratio can be derived.

Figure 2A:
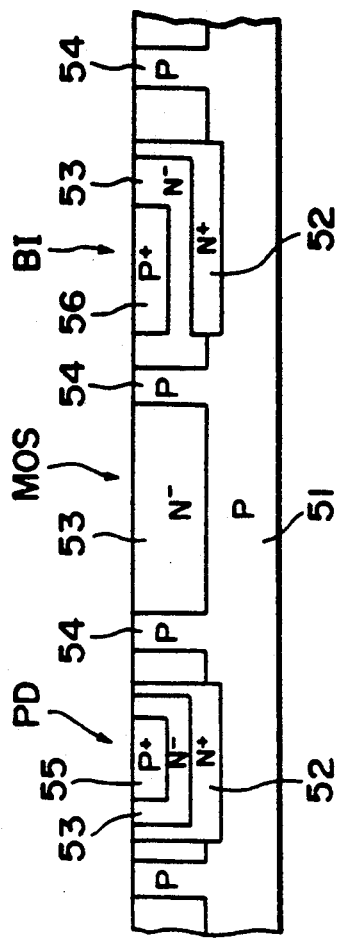
FIGS. 2A, 2B and 2C are schematic manufacturing process diagrams showing an embodiment of a method of manufacturing a photosensor according to the invention.
Figure 2B:
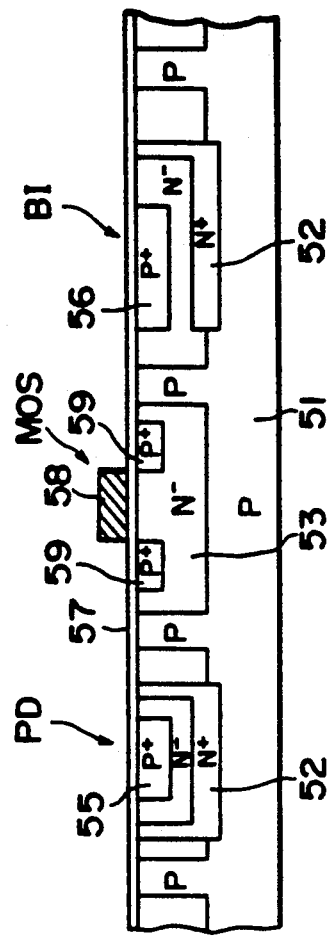
Figure 2C:
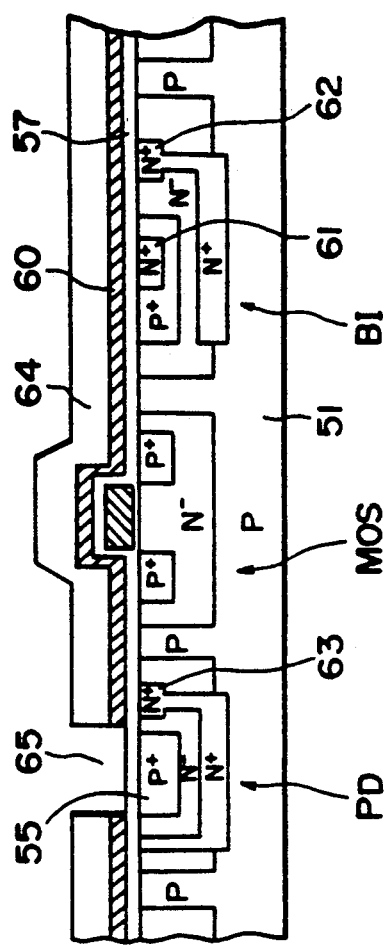

FIGS. 2A to 2C are schematic manufacturing process diagrams showing an embodiment of a method of manufacturing a photosensor according to the present invention.

In FIG. 2A, N+ buried layers 52, N- epitaxial layers 53, and P regions 54 for separation of elements are first formed in a P-type silicon substrate 51. In this diagram, there are shown a photo diode region PD (corresponding to the photo diode 1 in FIG. 1), a MOS transistor region MOS (corresponding to the MOS transistors 24 and 25 in FIG. 1), and a bipolar region BI corresponding to the bipolar transistors 26, 27, 28, etc. in FIG. 1).

Subsequently, p-type impurities such as boron or the like are simultaneously diffused in each N- epitaxial layer 53 of the regions PD and BI and thereby to simultaneously form a P+ region 55 of the P-N junction of the photo diode and a base region 56 of the NPN bipolar transistor. However, the depth of P+ region 55 determines the spectral sensitivity characteristic of the photo diode and the depth of the base region 56 exerts an influence on the characteristic of the bipolar transistor; therefore, it is necessary to form the P+ diffusion regions 55 and 56 in consideration of both of those characteristics.

Next, as shown in FIG. 2B, an oxide film 57 for a MOS gate is formed and a polysilicon gate 58 is formed on the oxide film 57. Subsequently, P-type impurity ions are implanted using the gate 58 as a mask and P+ regions 59 serving as a source and a drain are formed by way of a thermal diffusion.

Then, as shown in FIG. 2C, the oxide film 57 on the region PD is further oxidized until it becomes a predetermined thickness. The oxide film 57 serves to prevent the light reflection as mentioned above, so that its thickness is significant.

After the oxide film 57 was formed to have the predetermined thickness, a silicon nitride (Si3N4) film 60 is formed thereon. The oxide film 57 is protected from the etchant or the like by the silicon nitride film 60, and at the same time the entering of ions into each semiconductor element, which could cause a defect of the photosensor, is prevented.

Subsequently, an emitter region 61 and an ohmic contact region 62 of a collector are formed in the region BI and an ohmic contact region 63 is formed in the region PD by way of implantation and diffusion of N-type impurity ions of phosphorus or the like. Aluminum wirings are formed to constitute the circuit shown in FIG. 1 and then a protection film 64 (insulating film between layers, light shielding metal film, and passivation film etc.) is formed.

The protection film 64 on the photosensing surface of the region PD is removed due to etching. Subsequently, the silicon nitride film 60 is removed by way of plasma etching for allowing the oxide film 57 to be exposed, and thereby forming a photo sensing section 65.

The gas of CF4+O2 (4%) is used as a plasma etching gas. Since this gas has a selection ratio of about 7 between silicon nitride and silicon oxide, only the silicon nitride film 60 can be removed with hardly etching the oxide film 57.

In this way, by use of the film having a relatively higher etching selection ratio to the oxide film 57 as a protection film of the oxide film 57, it is possible to safely protect the oxide film 57 for prevention of reflection which requires a high precision with respect to the thickness.

The thickness of the oxide film 57 is decided in the following manner.

Assuming that the refractive index of the meduim (in this case, air) in the outside of the oxide film 57 is $n_0$, the refractive index of the oxide film 57 is $n_1$, and the refractive index of the medium (in this case, silicon) in the inside of the oxide film 57 is $n_2$, the reflection factor R at the surface of the P+ region 55 of the photodiode region PD is obtained by the following equations:

$$R = \frac{r_1 + r_2 \exp(i\delta)}{1 + r_1 r_2 \exp(i\delta)}$$

where, $$r_1 = \frac{n_0 - n_1}{n_0 + n_1}$$

$$r_2 = \frac{n_1 - n_2}{n_1 + n_2}$$

$$\delta = \frac{2\pi}{\lambda} (2 n_1 d_1)$$

$\lambda$ is a wavelength of the incident light and
$d_1$ is a thickness of the oxide film 57.

The value of $d_1$ which makes the reflection factor R zero is obtained from the above equations and the thickness of the oxide film 57 is controlled so as to become $d_1$. Due to this, the photo diode having a high sensitivity can be manufactured without losing the light at the surface of the diode.

As described in detail in the above, according to the photo sensor of the invention, the input impedance becomes extremely high and the leakage current is small, so that even in case of a very small photo current, it can be stably detected with a good S/N ratio.

On one hand, according to the method of manufacturing the photo sensor of the invention, the above-mentioned photo sensor with high characteristic can be manufactured using general integrated circuit manufacturing processes. In particular, the processes to form the semiconductor region and oxide film which require the control in the direction of depth can be simplified. Further, the base region of the bipolar transistor and the photosensitive region of the photoelectric converting section of the same conductivity type as the base region are simultaneously formed, and the transparent protection film of the photoelectric converting section and the protection films of other transistors are simultaneously formed, so that the manufacturing processes are simplified.

We claim:

1. A method for manufacturing a photosensor comprising the steps of:

first forming, on a common semiconductor substrate of a first conductivity type, first, second and third semiconductor regions of a second conductivity type different from the first conductivity type, wherein said second semiconductor region is located between said first and third semiconductor regions;

simultaneously forming a fourth semiconductor region and a base region of the first conductivity type;

subsequent to said simultaneous forming step, forming source and drain regions of the first conductivity type within said second semiconductor region; and forming high impurity concentration semiconductor regions in said first and third regions, respectively, thereby forming a photoelectric conversion element in said first semiconductor region, forming an insulated gate type transistor in said second semiconductor region, and forming a bipolar transistor in said third semiconductor region.

2. A method according to claim 1, wherein said photoelectric conversion element and said bipolar transistor includes a buried region comprising said high impurity concentration semiconductor region of the second conductivity type.

3. A method according to claim 1, wherein said first, second and third semiconductor regions are isolated by a semiconductor element isolation region of the first conductivity type.

4. A method according to claim 1, further comprising the step of forming a gate electrode after said simultaneous formation step and prior to said source region and drain region formation step.

5. A method according to claim 1, further comprising the step of forming a light shielding layer shielding said insulated gate type transistor and said bipolar transistor.

* * * * *

UNITED STATES PATENT AND TRADEMARK OFFICE
CERTIFICATE OF CORRECTION

PATENT NO. : 5,268,309
DATED : HIDEMASA MIZUTANI, ET AL.
INVENTOR(S) : December 7, 1993

It is certified that error appears in the above-indentified patent and that said Letters Patent is hereby corrected as shown below:

At [56], "59-27104 of 1975 Japan" should read --59-27104 10/1975 Japan--; and "62-14478 of 1985 Japan" should read --62-14478 7/1985 Japan--.
At [57], line 10, "ptotection" should read --protection--; and line 12, "photoelectirc" should read --photoelectric--.

COLUMN 1
   Line 30, "photo sensor" should read --photosensors--.

COLUMN 2
   Line 60, "$V_0$from" should read --$V_0$ from--.
   Line 66, "imputted" should read --inputted--.

COLUMN 3
   Line 36, "was" should read --is--.

Signed and Sealed this

Twelfth Day of July, 1994

Attest:

BRUCE LEHMAN

Attesting Officer          Commissioner of Patents and Trademarks